(12) United States Patent
Wallberg et al.

(10) Patent No.: US 7,801,262 B2
(45) Date of Patent: Sep. 21, 2010

(54) ALL DIGITAL PHASE LOCKED LOOP ARCHITECTURE FOR LOW POWER CELLULAR APPLICATIONS

(75) Inventors: John Wallberg, Richardson, TX (US); Robert B. Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 919 days.

(21) Appl. No.: 11/551,150

(22) Filed: Oct. 19, 2006

(65) Prior Publication Data
US 2007/0085579 A1    Apr. 19, 2007

Related U.S. Application Data

(60) Provisional application No. 60/728,270, filed on Oct. 19, 2005.

(51) Int. Cl.
    *H03D 3/24*    (2006.01)
(52) U.S. Cl. .................. 375/376; 375/373; 375/375; 375/295; 331/1 A; 331/14; 331/17; 331/25; 327/159
(58) Field of Classification Search .................. 375/376, 375/373, 375, 295; 331/1 A, 14, 17, 25; 327/147, 150
    See application file for complete search history.

(56) References Cited

U.S. PATENT DOCUMENTS 7,183,860 B2 *  2/2007  Staszewski et al. ......... 331/1 A
7,279,988 B1 * 10/2007  Janesch et al. ................ 331/10
2003/0133522 A1  7/2003  Staszewski et al.
2004/0146132 A1  7/2004  Staszewski et al.
2006/0033582 A1  2/2006  Staszewski et al.
2006/0038710 A1  2/2006  Staszewski et al.

OTHER PUBLICATIONS

R. B. Staszewski et al., "All-Digitial PLL and GSM/EDGE Transmitter in 90nm CMOS," IEEE International Solid-State Circuits Conference, Feb. 2005, pp. 316-217, 600.
R. B. Staszewski et al., "A Digitally Controlled Oscillator in a 90 nm Digital CMOS Process for Mobile Phones," IEEE Journal of Solid-State Circuits, vol. 40, No. 11, Nov. 2005, pp. 2203-2211.
R. B. Staszewski et al., "All-Digital PLL and Transmitter for Mobile Phones," IEEE Journal of Solid-State Circuits, vol. 40, No. 12, Dec. 2005, pp. 2469-2482.

(Continued)

*Primary Examiner*—Phuong Phu
(74) *Attorney, Agent, or Firm*—Wade J. Brady, III; Frederick J. Telecky, Jr.

(57) ABSTRACT

A novel mechanism that is operative to observe and compare the differentiated phase of the reference and variable PLL loop signals using a frequency detector. The resultant phase differentiated error is then accumulated to yield the phase error. The operation of the loop with the frequency detector is mathematically equivalent to that of the phase detector. A frequency error accumulator is used to generate the integral of the frequency error. The frequency error accumulator also enables stopping the accumulation of the frequency upon detection of a sufficiently large perturbation, effectively freezing the operation of the loop as subsequent frequency error updates are not accumulated. Upon removal of the phase freeze event, accumulation of the frequency error and consequently normal loop operation resumes.

18 Claims, 6 Drawing Sheets

OTHER PUBLICATIONS

C. H. Hung et al., "A Digitally Controlled Oscillator System for SAW-Less Transmitters in Cellular Handsets," IEEE Journal of Solid-State Circuits, vol. 41, No. 5, May 2006, pp. 1160-1170.

K. Muhammad et al., "The First Fully Integrated Quad-Band GSM/GPRS Receiver in a 90-nm Digital CMOS Process," IEEE Journal of Solid-State Circuits, vol. 41, No. 8, Aug. 2006, pp. 1772-1783.

Y. C. Ho et al. "Charge-Domain Signal Processing of Direct RF Sampling Mixer with Discrete-Time Filters in Bluetooth and GSM Receivers," EURASIP Journal on Wireless Communications and Networking, vol. 2006, Article 62905, pp. 1-14.

M. Nakai et al., "Dynamic Voltage and Frequency Management for a Low-Power Embedded Microprocessor," IEEE Journal of Solid-State Circuits, vol. 40, No. 18, Jan. 2006, pp. 28-35.

* cited by examiner

ALL DIGITAL PHASE LOCKED LOOP ARCHITECTURE FOR LOW POWER CELLULAR APPLICATIONS

REFERENCE TO PRIORITY APPLICATION

This application claims priority under 35 U.S.C. §119(e) to U.S. Provisional Application Ser. No. 60/728,270, filed Oct. 19, 2005, entitled "New ADPLL architecture for low-power cellular applications," incorporated herein by reference in its entirety.

FIELD OF THE INVENTION

The present invention relates to the field of communications and more particularly relates to an all digital phase locked loop (ADPLL) architecture incorporating frequency error detection suitable for low power cellular applications.

BACKGROUND OF THE INVENTION

A block diagram illustrating a prior art all digital phase-domain PLL incorporating time to digital converter (TDC) and digitally controlled oscillator (DCO) circuits with wideband frequency modulation capability is shown in FIG. 1. The ADPLL, generally referenced 10, comprises a reference phase accumulator 12, time to digital converter (TDC) system 14, phase detector 16, loop filter 18, DCO gain normalizer 20 and digitally controlled oscillator (DCO) 22. The digitally-controlled oscillator produces a digital clock CKV in the RF frequency band. In the feedforward path, the CKV clock toggles an NMOS transistor switch of the near class-E RF power amplifier (not shown) that is followed by a matching network, and then terminated with an antenna.

In the feedback path, the CKV clock is used to retime the frequency reference or FREF clock. The FREF retiming quantization error is determined by the time-to-digital converter (TDC), which is build as an array of inverter delay elements and registers, in order to compensate the quantization error by the system. An integer part of the variable phase is determined by counting the number of rising clock transitions of the DCO oscillator clock CKV. The TDC system quantizes and measures the time differences between the FREF and DCO edges, i.e. the fractional part of the variable phase. The variable phase is subtracted from the reference phase by the phase detector. The reference phase is generated by accumulating the frequency command word (FCW). The phase error samples are then sampled and then scaled and filtered to be used as the DCO tuning word.

A block diagram highlighting the use of a phase detector to generate the phase error in the prior art ADPLL of FIG. 1 is shown in FIG. 2. The circuit, generally referenced 70, comprises a reference phase accumulator 71 and phase detector 76. The reference phase accumulator comprises an adder 72 and register 74 which are operative to accumulate the frequency command word (FCW)

Like most prior art approaches to phase locked loop design, the ADPLL described above employs a phase detector which performs phase comparison between reference phase and variable phase signals. A disadvantage of basing operation of the loop on phase detection, however, is that it makes it very difficult and nearly impossible for the PLL to minimize perturbations to the loop. Perturbations to the loop may be caused, for example, by large phase errors that are generated for any number of reasons, e.g., large settling time on DCO varactor banks, frequency band switching, spikes in the output of the power amplifiers, etc. As a result, large perturbations may violate the RF system specifications or even exceed the dynamic limits of the loop and cause the phase detector to output inaccurate phase errors which are propagated through the loop filter to the DCO resulting in jumps in output frequency. It is desirable to have the PLL avoid any negative effects of these perturbations by 'sleeping' through them. The operation of the loop during these perturbations, however, cannot be stopped as the loop is dependent on phase and phase is the integral of frequency in time and thus cannot be stopped since accumulation of the phase must be maintained. Thus, there is potential for the loop to become unstable if the perturbation is severe enough.

There is thus a need for a mechanism that is capable of detecting a potentially disturbing perturbation at the input to the PLL. It is also desirable that in response to the detection of a perturbation, the mechanism have the capability of temporarily freezing the operation of the PLL until the perturbation has passed (at least sufficiently enough to minimize any negative impact to the loop operation).

SUMMARY OF THE INVENTION

The present invention overcomes the problems associated with the prior art by providing a mechanism that is operative to observe and compare the differentiated phase of the reference and variable PLL loop signals using a frequency detector. The resultant phase differentiated error is then accumulated to yield the phase error. Thus, the mechanism of the invention replaces at the core the prior art phase detector with a frequency detector, although the top-level transfer function during normal operation is still substantially the same. This requires the variable phase to be differentiated and the resultant frequency error integrated.

The operation of the loop with the frequency detector followed by an integrator is mathematically equivalent to that of the phase detector. A major benefit of using frequency detection rather than phase detection, however, is that the loop can be frozen without causing the loop to become unstable or to oscillate. A frequency error accumulator is used to generate the integral of the frequency error. The frequency error accumulator also comprises means for stopping the accumulation of the frequency upon the occurrence of a phase freeze event. This effectively freezes the operation of the loop as subsequent frequency error updates are not accumulated. A phase freeze event is generated by comparing the frequency error signal to a fixed or dynamic threshold. Upon removal of the phase freeze event, accumulation of the frequency error and consequently normal loop operation resumes.

There is thus provided in accordance with the invention, a frequency synthesizer incorporating a phase locked loop (PLL) comprising a digitally controlled oscillator (DCO) operative to generate a variable clock having a frequency determined by an oscillator tuning word input thereto, a frequency detector operative to generate a frequency error between a frequency reference and a differentiated variable clock, a frequency error accumulator operative to accumulate the frequency error, and means coupled to the frequency error accumulator, the means for generating the oscillator tuning word in response to the accumulated frequency error.

There is also provided in accordance with the invention, a phase locked loop (PLL) for use in a frequency synthesizer comprising a digitally controlled oscillator (DCO) operative to generate a variable oscillator signal having a frequency determined by an oscillator tuning word input thereto, means for generating a variable differentiated phase signal from the variable oscillator signal, a frequency detector operative to generate a frequency error between a frequency reference and the variable differentiated phase signal, a frequency error accumulator operative to accumulate the frequency error to generate a phase error therefrom and a loop filter operative to filter the phase error to generate the oscillator tuning word thereby.

There is further provided in accordance with the invention, a phase locked loop (PLL) for use in a frequency synthesizer comprising a digitally controlled oscillator (DCO) operative to generate a variable oscillator signal having a frequency determined by an oscillator tuning word input thereto, differentiator means for generating a differentiated variable phase signal from the variable oscillator signal, a frequency detector operative to subtract the differentiated variable phase signal from a reference frequency command word to generate a frequency error therefrom, a frequency error accumulator operative to accumulate the frequency error to generate a phase error therefrom, and to stop accumulating the frequency error in response to a phase freeze event thereby preventing subsequent frequency error samples from effecting the loop and a loop filter operative to filter the phase error to generate the oscillator tuning word thereby.

There is also provided in accordance with the invention, a method of generating a phase error signal in a phase locked loop (PLL) based frequency synthesizer, the method comprising the steps of generating a differentiated variable phase signal from a variable oscillator signal, the variable oscillator signal generated by a digitally controlled oscillator (DCO) operative to generate the variable oscillator signal in response to an oscillator tuning word, subtracting the differentiated variable phase signal from a frequency reference signal to yield a frequency error therefrom, accumulating the frequency error to generate a phase error therefrom, suspending accumulation of the frequency error in response to a phase freeze event thereby preventing subsequent frequency error samples from effecting the loop and filtering the phase error signal to yield the oscillator tuning word therefrom.

Note that some aspects of the invention described herein may be constructed as software objects that are executed in embedded devices as firmware, software objects that are executed as part of a software application on either an embedded or non-embedded computer system such as a central processing unit (CPU), digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document.

| Term | Definition |
| --- | --- |
| AFC | Automatic Frequency Control |
| ASIC | Application Specific Integrated Circuit |
| CMOS | Complementary Metal Oxide Semiconductor |
| CPU | Central Processing Unit |
| DAC | Digital to Analog Converter |
| DCXO | Digitally Controlled Crystal Oscillator |
| DEM | Dynamic Element Matching |
| DSP | Digital Signal Processor |
| FPGA | Field Programmable Gate Array |
| HDL | Hardware Description Language |
| NMOS | n-channel Metal Oxide Semiconductor |
| RF | Radio Frequency |

ADPLL Employing Frequency Detection

The present invention is a mechanism operative to observe and compare the differentiated phase of the reference and variable PLL loop signals using a frequency detector. The resultant phase differentiated error is then accumulated to yield the phase error. The operation of the loop with the frequency detector is mathematically equivalent to that of the phase detector in its normal (uninterrupted) mode of operation. A frequency error accumulator is used to generate the integral of the frequency error. The frequency error accumulator also enables stopping the accumulation of the frequency upon detection of a sufficiently large perturbation, effectively freezing the operation of the loop as subsequent frequency error updates are not accumulated. Upon removal of the phase freeze event, accumulation of the frequency error and consequently normal loop operation resumes.

Figure 1:
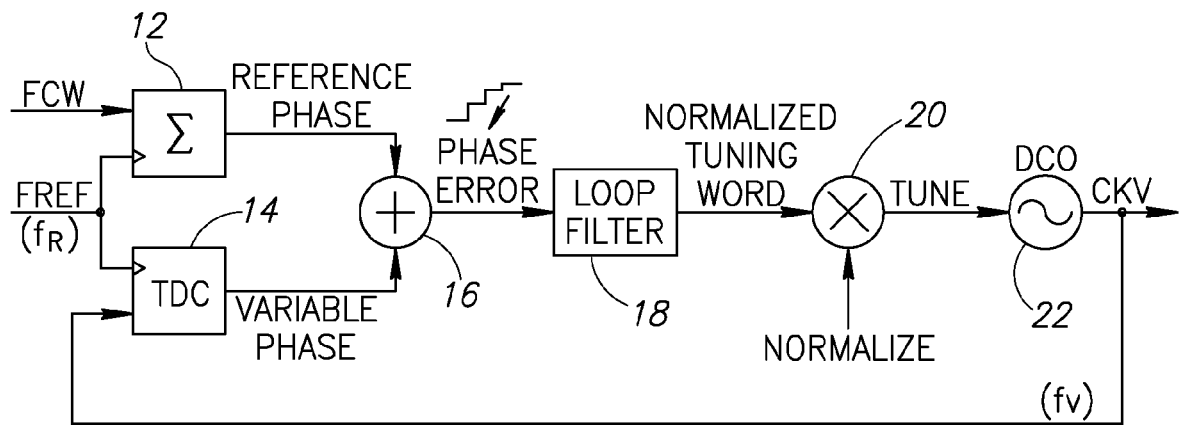
FIG. 1 is a block diagram illustrating a prior art all digital phase-domain PLL incorporating TDC and DCO circuits.
Figure 2:
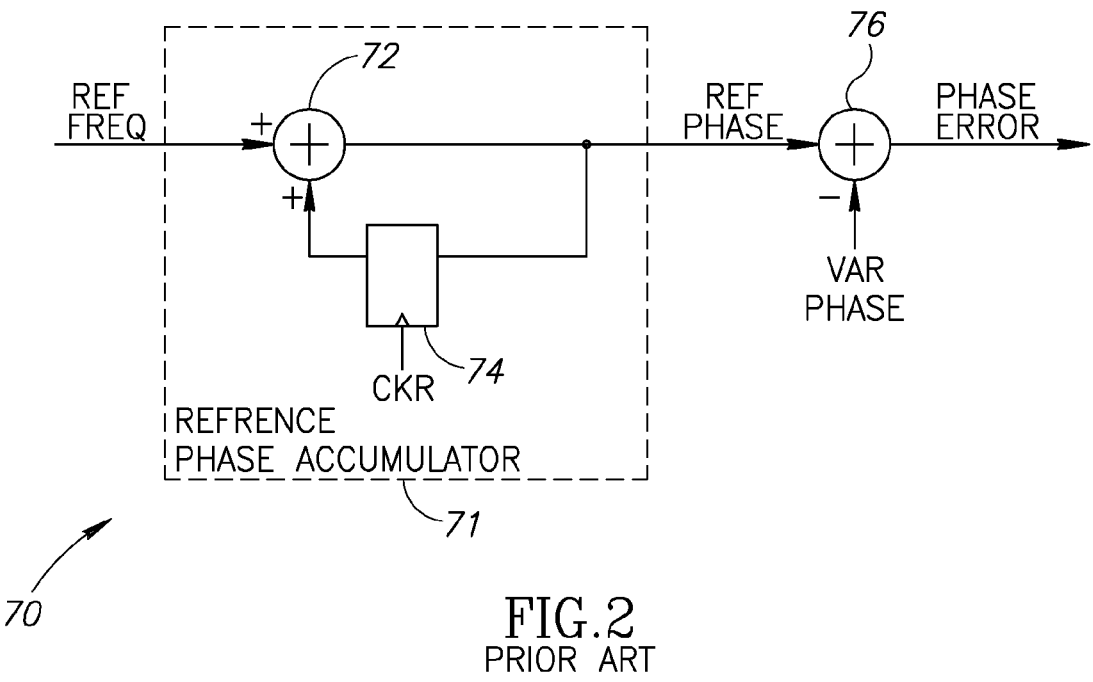
FIG. 2 is a block diagram highlighting the use of a phase detector to generate the phase error in the prior art ADPLL of FIG. 1.
Figure 3:
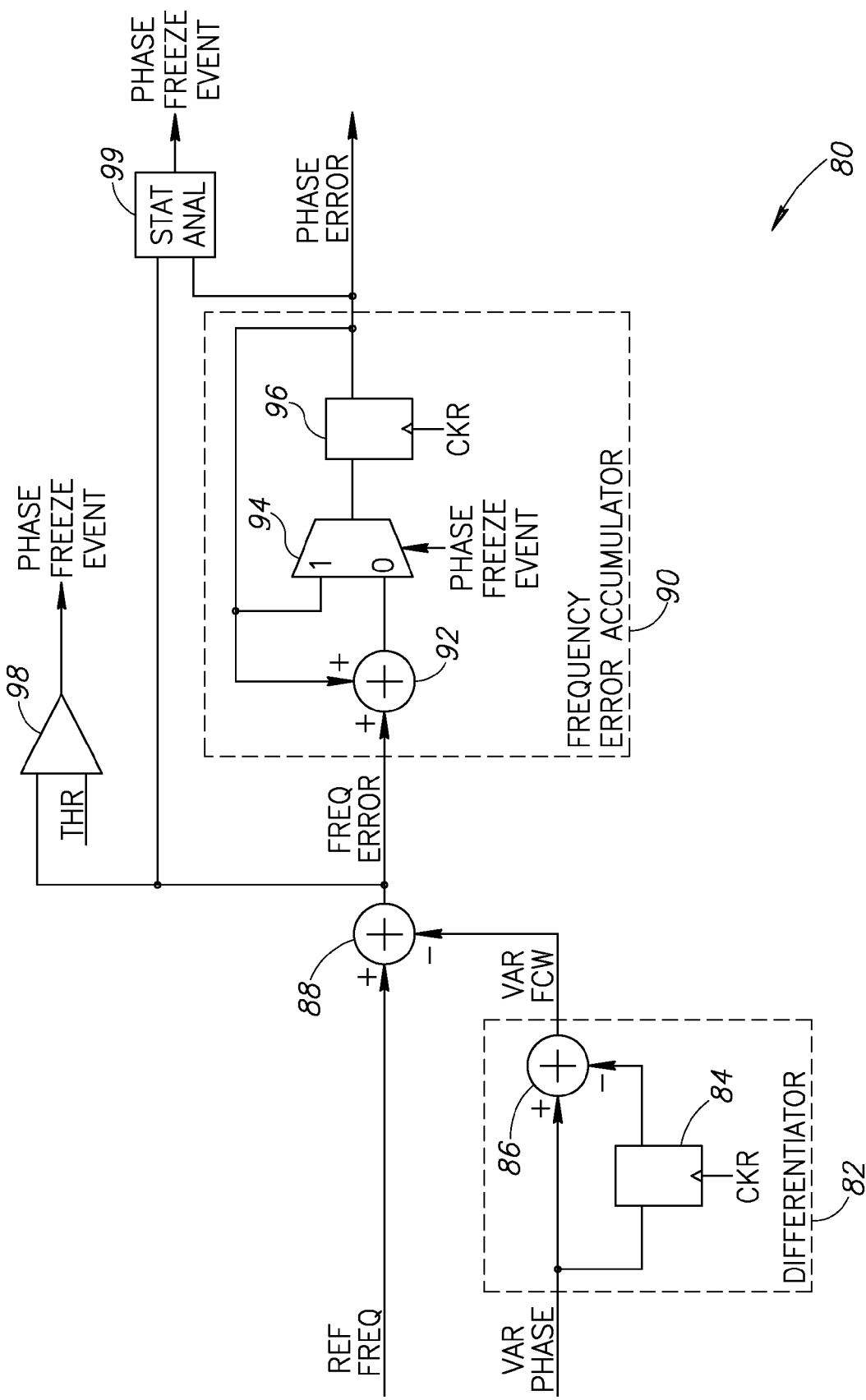
FIG. 3 is a block diagram of an example circuit illustrating the use of frequency detection in the ADPLL loop in accordance with an exemplary embodiment of the present invention.

A block diagram of an example circuit illustrating the use of frequency detection in the ADPLL loop in accordance with an exemplary embodiment of the present invention is shown in FIG. 3. The circuit, generally referenced 80, comprises a variable phase differentiator block 82, frequency detector 88 and frequency error accumulator (or integrator) 90.

In accordance with the present invention, a key feature is the use of frequency detection in the core of the PLL loop rather than the use of phase detection. Thus, the ADPLL is operated in the difference mode in its core using frequency instead of phase. A major benefit of using frequency detection rather than phase detection is that the operation of the ADPLL can now be stopped. The use of frequency detection permits ADPLL operation to be 'frozen' in time such as upon the detection of a sufficiently severe perturbation to the loop. For example, in the event of a problem in a portion of the circuit, e.g., RF power amplifier creating perturbations, DCO varactor bank settling, DC-DC converter activity change, digital baseband activities, dynamic voltage and frequency scaling (DVFS) activity, etc., rather than have the loop absorb the impact of these perturbations, the loop is shut down until the perturbations pass. Since the loop operates in the frequency error domain, time can be frozen by simply stopping the clock or preventing the accumulation of the frequency error.

With reference to FIG. 3, since the loop detection takes place using frequency detection at its core, the variable phase is differentiated first via differentiator 82, comprising register 84 and adder 86. The output of the differentiator 82 is the variable frequency signal which is subtracted from the input reference frequency (i.e. FCW) via frequency detector 88. The output of the frequency detector is the frequency error signal which is then integrated back to a phase error by the frequency error accumulator circuit 90. The frequency error accumulator circuit comprises adder 92, multiplexer 94 and register 96.

In operation, adder 92 and register function as an accumulator to generate the integral of the frequency error. In the absence of a phase freeze event, the phase error is fed back to the adder 92 and added to the next update of the frequency error output of the frequency detector 88. The sum is clocked into register 96 and fed back to the adder 92 to generate the next update of the phase error. At the occurrence of a phase freeze event, the select line to the multiplexer is configured to select the current phase error output rather than the new phase error sample updated with the current value of the frequency error. This effectively freezes the operation of the loop as the loop filter and DCO operate on the last value of the phase error clocked into the register 96. Operation of the loop is frozen until termination of the phase freeze event whereby the phase freeze event signal is removed and select line of the multiplexer is configured to select the output of the adder 92. This effectively unfreezes the operation of the loop and updating of phase error samples resumes.

It is important to note that the use of a frequency error detector in accordance with the present invention is mathematically equivalent to the prior art phase detection scheme. Since the PLL is a linear system, differentiating before the frequency detector and taking the integral of the output of the frequency detector is equivalent to the phase detection scheme of the prior art. Although these two schemes are mathematically equivalent, there are numerous benefits for performing frequency detection.

A major benefit discussed supra is that the operation of the PLL can be frozen in response to a a-priori predicted or a-posteriori detected perturbation. Another benefit is that lower power operation can be achieved by periodically shutting down the PLL, such as every other clock cycle or twelve out of every 13 cycles. Yet another benefit is that a simpler yet more fault tolerant ADPLL circuitry could be build. Instead of adding unnecessary hardware complication to account for all possible fault conditions, the system can tolerate a certain low rate of the fault occurrence by stopping freezing the ADPLL operation. In addition, once it is determined that the PLL has settled to the proper frequency, the PLL can be shut down every other clock, for example, to save power.

The circuit 80 also comprises comparison means 98 (e.g., comparator) for detecting when the frequency error exceeds a threshold. The threshold may be fixed or configured dynamically depending on any number of conditions, policy, or operator configuration. In addition, the comparator may employ hysteresis either in hardware or software to eliminate rapid transitions around the threshold level. Upon the occurrence of a sufficiently large perturbation to the loop, the threshold is exceeded and a phase freeze event signal is generated. The phase freeze event signal applied in a suitable manner in accordance with the particular implementation of the mechanism of the invention. For example, the phase freeze signal may be applied directly to the frequency error accumulator causing it to immediately 'freeze' the operation of the PLL. Alternatively, the phase freeze event signal may be processed by software or firmware, such as performing statistical analysis 99 on the phase freeze event signals. Note that alternatively, the comparator 98 can be adapted to compare the phase error as well as or instead of the frequency error.

Similarly, a statistical analysis block 99 may optionally be employed that is operative to perform statistical analysis directly on the frequency error signal and/or on the phase error signal. As described supra, statistical analysis may be performed on the phase freeze event signal in addition to the frequency error signal output of the frequency detector.

Figure 7:
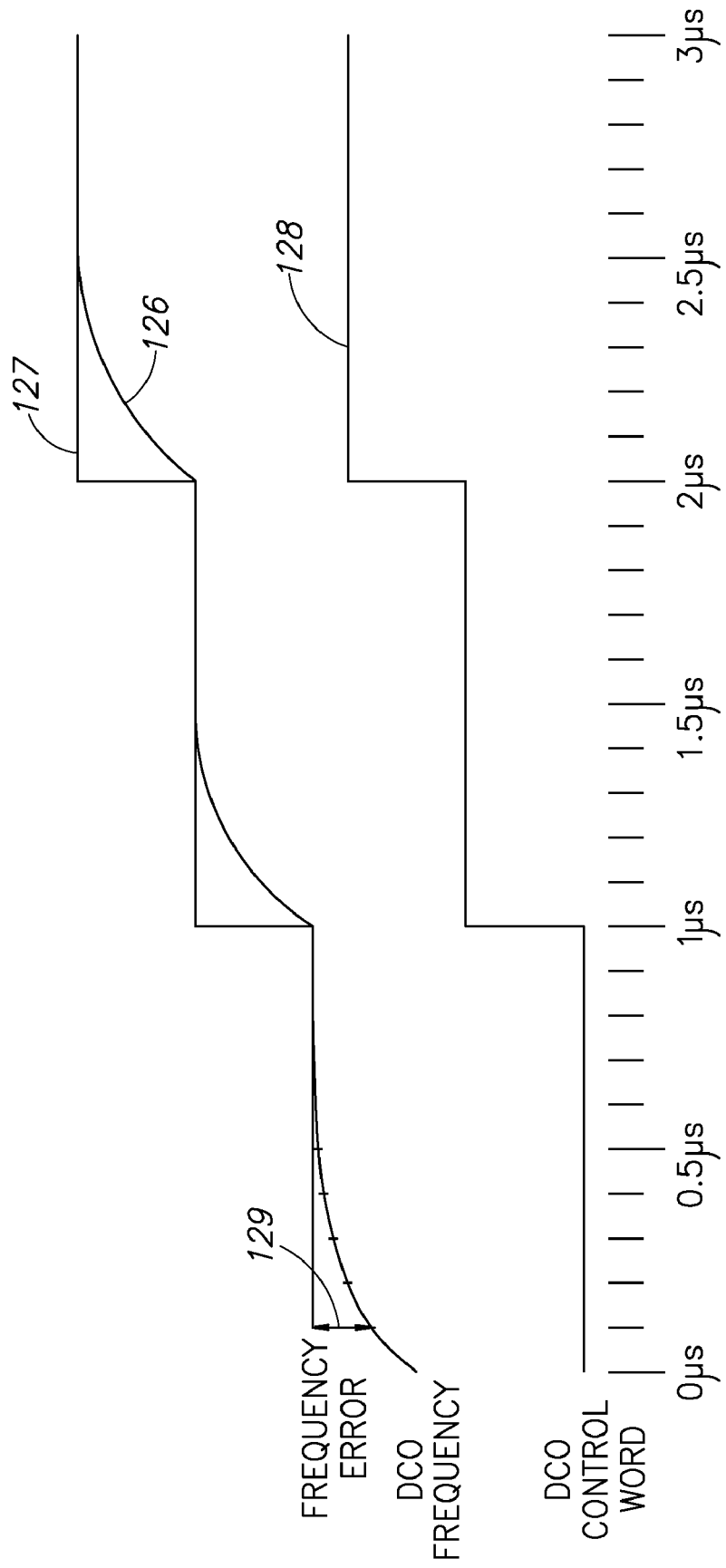
FIG. 7 is a plot illustrating the DCO frequency error and DCO tuning word as a function time during the PVT-interval settling.

A plot illustrating the DCO frequency deviation as a function of time during the PVT settling is shown in FIG. 7. Each tick of the time axis represents 200 nanoseconds. For each tick, the DCO control word 128 (i.e. the oscillator tuning word), expected DCO frequency 127, actual DCO output frequency 126 and the actual frequency error due to DCO settling 129 are shown.

In operation, as a result of the comparator 98 or statistical analysis block 99 or if the frequency error exceeds a threshold, the loop is frozen (i.e. frequency error accumulator operated is stopped). When the DCO value first changes, the frequency has some settling associated with it. This is due to use a PVT capacitor bank having a relatively large frequency step. It is not desirable to include samples that contain large errors because these will result in bad decisions from the detector. The frequency error terms are relatively large in the first few samples and then get progressively smaller and smaller with time. During the interval where the magnitude of the frequency error is large, the mechanism of the invention freezes the loop either for a fixed time duration or until the perturbation is removed, i.e. the capacitor bank settles to within an acceptable margin.

Figure 4:
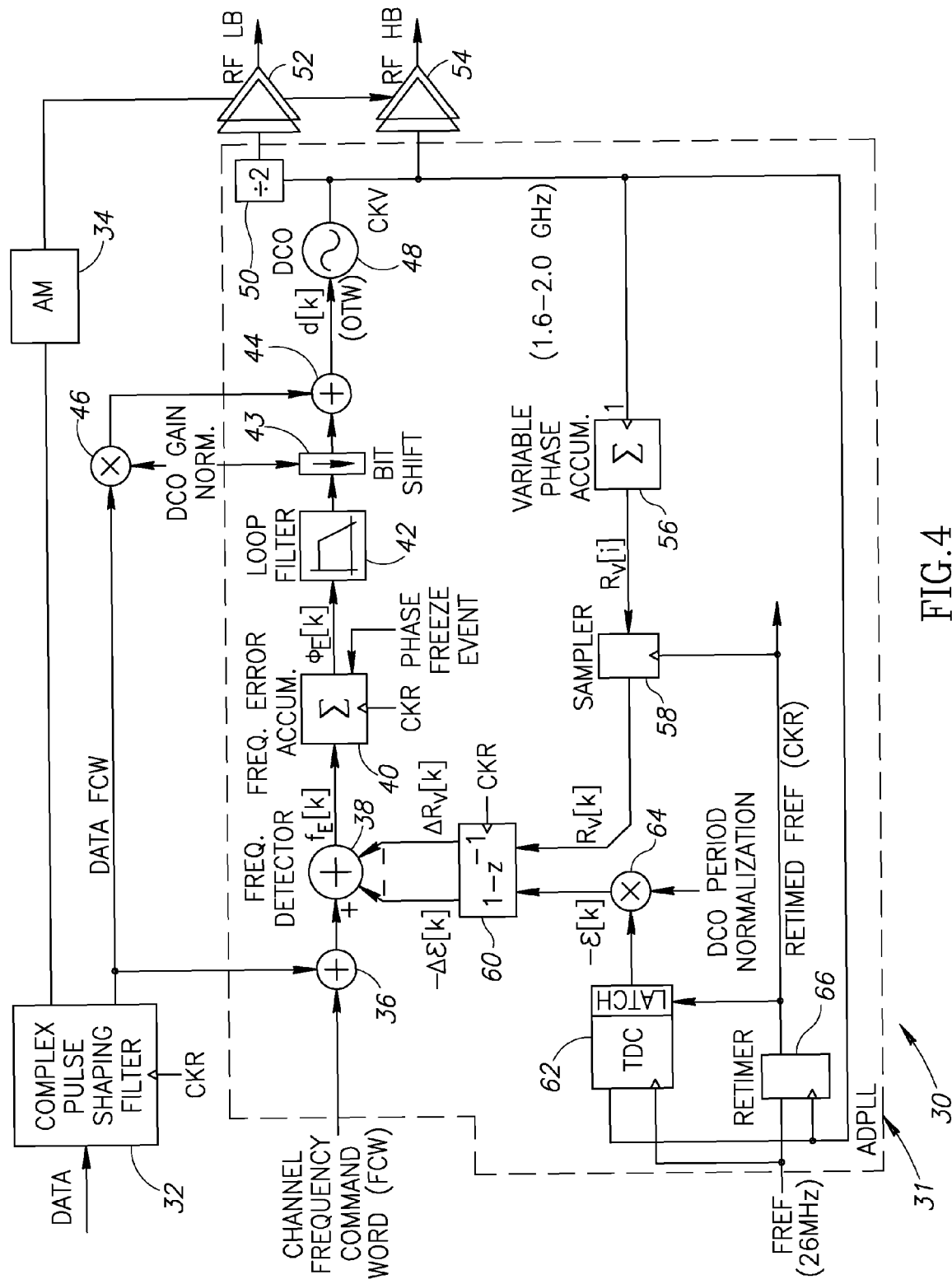
FIG. 4 is a block diagram illustrating a polar transmitter based on an ADPLL employing frequency detection in accordance with an exemplary embodiment of the present invention.

A block diagram illustrating a polar transmitter based on an ADPLL employing frequency detection in accordance with an exemplary embodiment of the present invention is shown in FIG. 4. A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," and U.S. Patent Publication No. 2006/0038710A1, published Feb. 23, 2006, Staszewski et al., entitled "Hybrid Polar/Cartesian Digital Modulator," both of which are incorporated herein by reference in their entirety.

The transmitter, generally referenced 30, is well-suited for a deep-submicron CMOS implementation. The circuit 30 is operative to perform quadrature modulation in the polar domain in addition to the generation of the local oscillator (LO) signal for the receiver. All clocks in the system are derived directly from this source. Note that the transmitter is constructed using digital techniques that exploit the high speed and high density of the advanced CMOS, while avoiding problems related to voltage headroom. The ADPLL circuit 31 replaces a conventional RF synthesizer architecture (based on a voltage-controlled oscillator (VCO) and a phase/frequency detector and charge-pump combination), with a digitally controlled oscillator (DCO) 48 and a time-to-digital converter (TDC) 62. All inputs and outputs are digital and some even at multi-GHz frequency.

The transmitter comprises complex pulse shaping block 32, amplitude modulation (AM) block 34, low band pre-power amplifier (PPA) 52 and high band PPA 54. The ADPLL 31 comprises adder 36, frequency detector 38, frequency error accumulator 40, loop filter 42, adder 44, DCO gain normalizer 46, DCO gain bit shift (PLL loop) 43, DCO 48, divider HB/LB 50, variable phase accumulator 56, sampler 58, FREF retimer 66, TDC 62 and TDC period normalizer 64.

Note that the clock input to the AM block may comprise CKR clock or CKV divided clock. The core of the ADPLL is a digitally controlled oscillator (DCO) 48 adapted to generate the RF oscillator clock CKV. The oscillator core (not shown) operates at twice the 1.6-2.0 GHz high band (HB) frequency, which is then divided for precise generation of RX quadrature signals. The single DCO is shared between transmit and receive and is used for both the high frequency bands (HB) and the low frequency bands (LB). An additional 4-bits of the tracking bank are dedicated for sigma-delta dithering in order to improve frequency resolution.

The DCO tuning capacitance is split into a large number of tiny capacitors that are selected digitally. Advanced lithography processes available today permit creation of extremely fine variable capacitors (i.e. varactors) at approximately 40 attofarads of capacitance per step, which equates to the control of only 250 electrons entering or leaving the resonating LC tank (not shown). Despite the small capacitance step, the resulting frequency step at the 2 GHz RF output is 10-20 kHz, which is too coarse for wireless applications. Thus, the fast switching capability of the transistors is utilized by performing programmable high-speed (225-900 MHz) dithering of the finest varactors. The duty cycle of the high/low capacitive states establishes the time-averaged resonating frequency resolution, now less than 1 kHz. All the varactors are realized as n-poly/n-well MOSCAP devices that operate in the flat regions of their CV curves.

The ADPLL operates in a digitally synchronous fixed-point phase domain but employs frequency detection rather than phase detection. The expected variable frequency $f_V$ is related to the reference frequency $f_R$ by the frequency command word (FCW) as follows.

$$FCW[k] \equiv \frac{E(f_V[k])}{f_R} \quad (1)$$

The FCW is time variant and is allowed to change with every cycle $T_R=1/f_R$ of the frequency reference clock. With $W_F=24$ fractional part word length of FCW, the ADPLL provides fine frequency control with 1.5 Hz accuracy, according to:

$$\Delta f_{res} = \frac{f_R}{2^{W_F}} \quad (2)$$

The number of integer bits $W_I=8$ was chosen to fully cover the GSM band frequency range of $f_V=1600$-$2000$ MHz with an arbitrary reference frequency $f_R \geq 8$ MHz.

The ADPLL sequencer traverses through the process, voltage, temperature (PVT) calibration and acquisition modes during channel selection and frequency locking and stays in the tracking mode during the transmission or reception of a burst. To extend the DCO range to accommodate for voltage and temperature drifts, and to allow wide frequency modulation, the coarser-step acquisition bits are engaged by subtracting an equivalent number (generally fractional) of the tracking bank varactors. The varactor frequency step calibration is performed just before each burst with minimal overhead using dedicated hardware.

The variable phase $R_V[i]$ determined by counting the number of rising clock transitions of the DCO oscillator clock CKV:

$$R_V[i] = \sum_{l=0}^{i} 1 \quad (3)$$

The index i indicates the DCO edge activity. The FREF sampled variable phase $R_V[k]$, where k is the index of the FREF activity edge activity, is fixed point concatenated with the normalized time-to-digital converter (TDC) output $\epsilon[K]$. The TDC measures and quantizes the time differences between the frequency reference (FREF) and the DCO clock edges. The sampled differentiated variable phase is subtracted from the frequency command word (FCW) by the digital frequency detector 38. The frequency error $f_E[k]$ samples $$f_E[k]=FCW-[(R_V[k]-\epsilon[k])-(R_V[k-1]-\epsilon[k-1])] \quad (4)$$

are accumulated (i.e. intergrated back to phase) via frequency error accumulator 40 to create the phase error $\phi_E[k]$ samples $$\phi_E[k] = \sum_{l=0}^{k} f_E[k] \quad (5)$$

Figure 5:
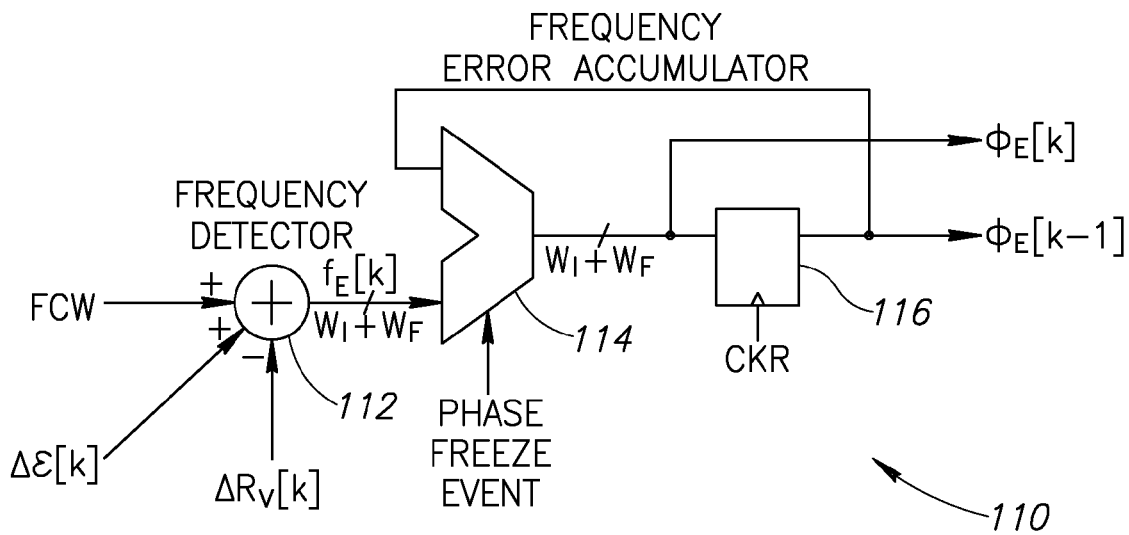
FIG. 5 is a diagram highlighting the frequency detection and phase freeze mechanism of the present invention in more detail.

A diagram highlighting the frequency detection and phase freeze mechanism of the present invention in more detail is shown in FIG. 5. The circuit, generally referenced 110, comprises the frequency detector 112, accumulator or integrator 114 and register 116. In accordance with the invention, the accumulator is adapted to freeze the operation of the loop by stopping the accumulator function and ceasing updating of the frequency error samples. The output of the accumulator remains fixed until the phase freeze event is removed.

Consider that the phase error hardware estimation can be expressed as $$\hat{\phi}_E(k)=R_R(k)-R_V(k)+\epsilon(k) \quad (6)$$

The previous phase error sample at time k−1 is expressed as $$\hat{\phi}_E(k-1)=R_R(k-1)-R_V(k-1)+\epsilon(k-1) \quad (7)$$

The reference phase expressed in accumulative form is $$R_R(k)=R_R(k-1)+FCW \quad (8)$$

Similarly, the variable phase can be written as $$R_V(k)=R_V(k-1)+\Delta R_V(k) \quad (9)$$

where $\Delta R_V(k)$ represents the number of whole CKV clock cycles between two consecutive edges of the retimed FREF clock (CKR). Inserting Equations 8 and 9 into Equation 6 results in $$\hat{\phi}_E(k)=[R_R(k-1)-R_V(k-1)]+[FCW-\Delta R_V(k)]+\epsilon(k) \quad (10)$$

and further substitution of Equation 7 simplifies the phase error equation to $$\hat{\phi}_E(k)=\hat{\phi}_E(k-1)+[FCW-\Delta R_V(k)]+[\epsilon(k)-\epsilon(k-1)] \quad (11)$$

Equation 11 is the difference form of the ADPLL frequency detector after integration by the frequency error accumulator. Thus, the use of a frequency detector in the loop is mathematically equivalent to the prior art circuit employing a phase detector.

The phase error samples are then filtered by a fourth order IIR filter in the loop filter 42 and scaled by a proportional loop attenuator $\alpha$. A parallel feed with coefficient $\rho$ adds an intergrated term to create type-II loop characteristics, which suppresses the DCO flicker noise.

The IIR filter is a cascade of four single stage filters, each satisfying the following equation $$y[k]=(1-\lambda)y[k-1]+\lambda x[k] \quad (12)$$

wherein
x[k] is the current input;
x[k] is the current output;
k is the time index;
$\lambda$ is the configurable coefficient.

The 4-pole IIR filter attenuates the reference and TDC quantization noise at an 80 dB/dec slope, primarily to meet the GSM spectral mask requirements at 400 kHz offset. The filtered and scaled phase error samples $\phi_E[k]$ are then multiplied by the DCO gain $K_{DCO}$ normalization factor $f_R/\hat{K}_{DCO}$, where $f_R$ is the reference frequency and $\hat{K}_{DCO}$ is the DCO gain estimate, to make the loop characteristics and modulation independent from $K_{DCO}$. The modulating data is injected into two points of the ADPLL to implement direct frequency modulation. A hitless gear-shifting mechanism for the dynamic loop bandwidth control serves to reduce the settling time. It changes the loop attenuator $\alpha$ several times during the frequency locking while adding the $(\alpha_1/\alpha_2-1)\phi_1$ DC offset to the phase error, where indices 1 and 2 denote before and after the event, respectively. Note that $\phi_1=\phi_2$ since the phase is to be continuous.

The FREF input is resampled by the RF oscillator clock (CKV) and the resulting retimed clock (CKR) clock is used throughout the system. This ensures that the massive digital logic is clocked after the quiet interval of the frequency error detection by the TDC.

Benefit of Frequency Detection: Elimination of Cycle Slipping

Figure 6:
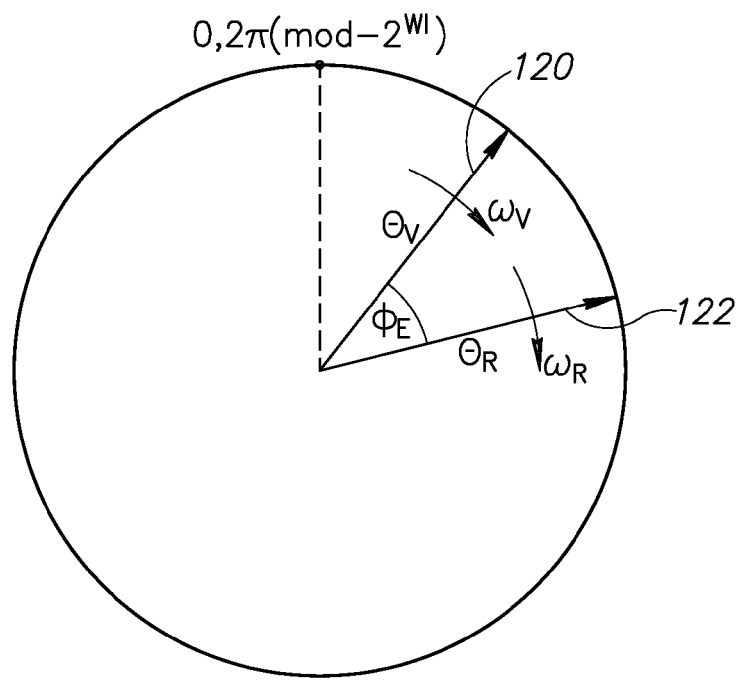
FIG. 6 is a diagram illustrating the rotating vector interpretation of the reference and variable phases.

A diagram illustrating the rotating vector interpretation of the reference and variable phases is shown in FIG. 6. As described supra, the variable and reference accumulators $R_V[i]$ and $R_R[k]$, respectively, are implemented in modulo arithmetic in order to practically limit word length of the arithmetic components. These accumulators are linear and grow without bound as time goes on. The modulo arithmetic on $R_V$ and $R_R$ can be visualized as two rotating vectors 120, 122 with the smaller angle between them constituting the phase error.

In the prior art PL circuit using phase detection, there was a possibility that as the phase error accumulates, the variable phase vector 120 gets further and further apart from the reference phase vector 122, which is referred to as cycle slipping. It is entirely possible that at some point a limit is reached wherein it becomes extremely difficult when comparing these two phase vectors to know (1) whether one or the other has hit its limit and cannot be extended any further or (2) one or the other vector is on its way back towards the other vector. Thus, considering the two rotating vectors, the reference and variable vectors reach a point where they are exactly 180 degrees on either side of circle. At this point, it is very difficult to determine whether one vector is coming back towards the other vector and getting smaller (i.e. approaching 179 degrees) or is getting larger (i.e. approaching 181 degrees). Thus, in performing phase detection as in the prior art eventually results in phase ambiguity as to the whether one phase vector is catching up or slowing down.

With rotating vectors, considering the prior art phase detection based PLL scheme, freezing the frequency requires the phase to continue rotating. The rotation of the phase vectors cannot be stopped because doing so would violate the phase domain operation and result in invalid data. Thus, rotating at different rates, the vectors eventually overflow. One vector ends up overtaking the other.

Operating in the frequency domain using the frequency detector in accordance with the invention, there are no rotating phase vectors because phase is obtained only after the reference and variable frequencies are subtracted from each other and then integrated. The only extra requirement for this scheme is the extra hardware required for the differentiation and integration circuits.

Benefit of Frequency Detection: Settling Time on PVT Capacitors

Figure 8:
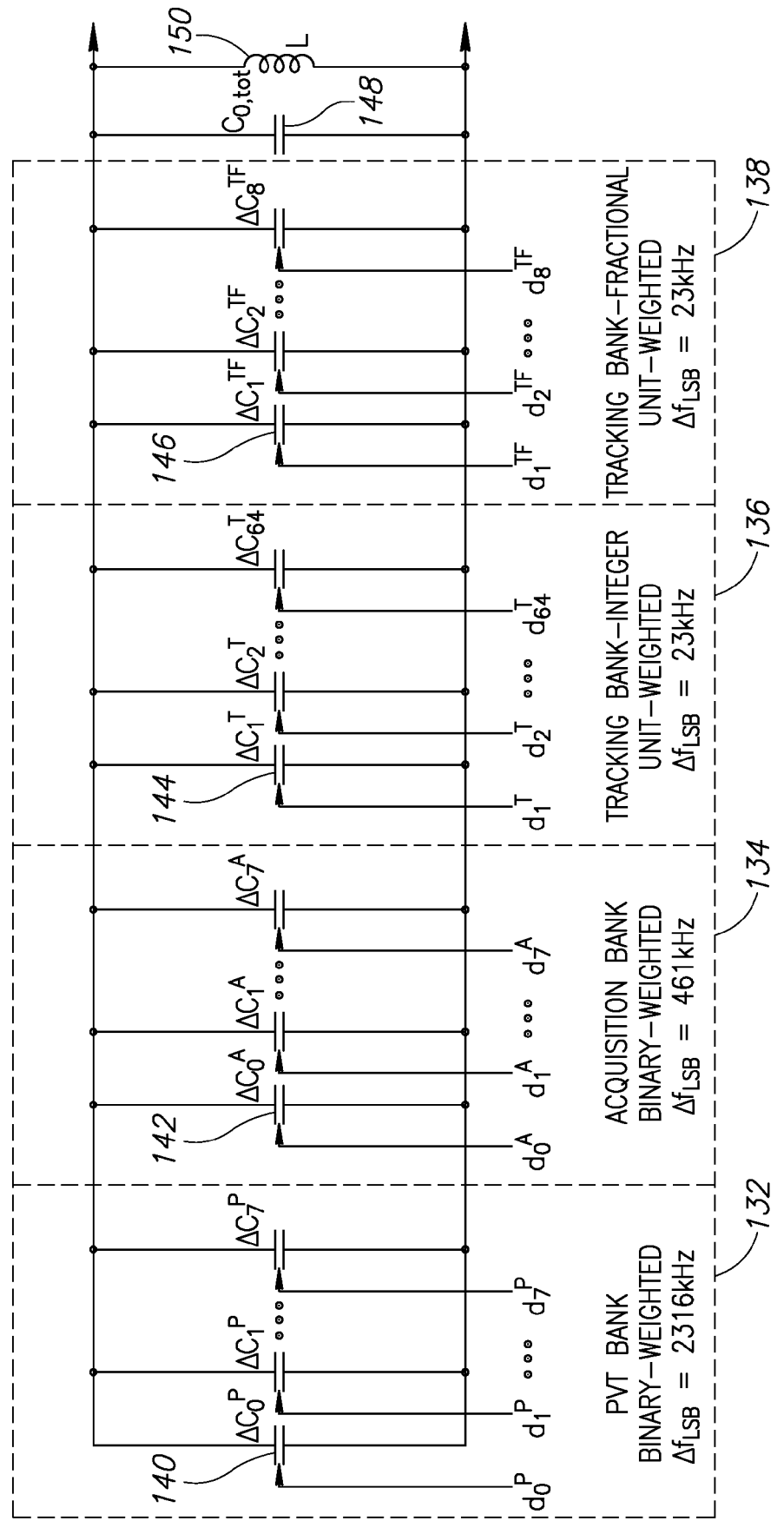
FIG. 8 is a circuit diagram illustrating LC tank with dedicated discrete capacitor banks for each of three ADPLL operational modes.

As described supra, the oscillating frequency of the DCO is controlled by use of a plurality of weighted binary switchable capacitance devices, i.e. varactors. An array of varactors is switched into either a high capacitance mode or a low capacitance mode individually by a two level digital control signal. In order to provide sufficient dynamic range, the process of locking the PLL involves traversing through three major operational modes with progressively lower frequency range and higher resolution. A circuit diagram illustrating LC tank with dedicated discrete capacitor banks for each of three ADPLL operational modes is shown in FIG. 8. The circuit, generally referenced 130, is adapted for Bluetooth and comprises binary weighted PVT bank 132 containing capacitors 140 with $\Delta f_{LSB}$=2316 kHz, binary weighted acquisition bank 134 containing capacitors 142 with $\Delta f_{LSB}$=461 kHz, integer unit weighted tracking bank 136 containing capacitors 144 with $\Delta f_{LSB}$=23 kHz, fractional unit weighted tracking bank 138 containing capacitors 146 with $\Delta f_{LSB}$=23 kHz, $C_0$ 148 representing lumped individual shunt capacitances and inductance 150. Note that the actual frequency steps can widely vary for different implementations as well as process and environmental conditions.

In the first step, the large oscillating frequency due to the process-voltage-temperature (PVT) variations is calibrated using the PVT capacitor bank. Following the PVT calibration, the nominal center frequency of the oscillator will be close to the center of the desired band. The second step is to acquire the requested operational channel within the available band using the acquisition capacitor bank. The third step is the finest, but with the most narrow-band range, and functions to track the frequency reference and to perform data modulation within the channel using the tracking capacitor banks. Note that the first and second banks 132, 134 approximately set the frequency during actual operation. During PVT and acquisition, the frequency range is relatively high but the required precision is relatively low.

Thus, the PVT capacitor bank is used to provide ultra-fast acquisition before the regular acquisition mode. However, the large capacitance of each step within the PVT capacitor bank (i.e. frequency step of 2316 MHz), causes long DCO settling times. The reference path of the loop, however, operates as if there is no delay. The variable path does, however, have delay associated with it. With the prior art phase detector based PLL, special dynamics need to be introduced into the loop to compensate for this delay.

The frequency detector based PLL scheme of the present invention, however, operates using frequency error at its core. Thus, to overcome this problem the operation of the accumulator is frozen during that period of time. The mechanism waits a certain number of clock cycles until the capacitors achieve sufficient settling and then the loop is turned back on again. Thus, the loop is allowed to settle without tracking the delay of the capacitors.

With reference to FIG. 8, every time a capacitor is switched within the PVT capacitor bank, a long settling time of approximately 1 microsecond is required. Unlike varactors in the other capacitor banks that change instantaneously, the large capacitors in this bank typically create slow settling. Assuming the loop is running at a 26 MHz clock rate, changing the LSB capacitor yields 2.3 MHz, multiplied by $2^{256}$ resulting in approximately 500 MHz for the MSB capacitor, a very large frequency step. Thus, changing these capacitors requires about 1 microsecond until the settling occurs. During this time, without the benefit of the present invention, this either causes the loop to become unstable or at best causes it to perform poorly. The loop may even begin oscillating depending on which particular bits are changing.

To prevent this, the output of the frequency detector is monitored and if the frequency error exceeds a threshold, the loop is frozen (as described in detail supra). Thus, the settling time problem is overcome by effectively slowing down the loop response so the slow settling has minimal effect on the performance. The loop is forced to sleep (i.e. accumulation of the frequency error stops) every time the varactor bank changes. The mechanism of the present invention enables the loop to be turned off for a finite length of time.

When the loop is woken up (i.e. accumulation of frequency error resumed), the decisions made are much better than if the loop was not frozen. Without the benefit of the invention, the loop would likely need more time to settle since it would send a large amount of time making bad decisions every clock cycle. In contrast, the mechanism of the present invention effectively eliminates the bad decisions during the time the loop is frozen. The settling time remains but in place of a slew of bad decisions, the loop is operative to now make fewer good decisions since the loop is kept from being influenced by the negative physical effect of the capacitor settling.

Note that in accordance with the present invention, the loop may be frozen at any time. Typically, the loop is frozen when some perturbation to the system is detected. It is appreciated that once skilled in the art can implement the mechanism of the invention to freeze the loop using any desired criteria.

In alternative embodiments, the methods of the present invention may be applicable to implementations of the invention in integrated circuits, field programmable gate arrays (FPGAs), chip sets or application specific integrated circuits (ASICs), DSP circuits, wired or wireless implementations and other communication system products.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A frequency synthesizer incorporating a phase locked loop (PLL), comprising:
   a digitally controlled oscillator (DCO) operative to generate a variable clock having a frequency determined by an oscillator tuning word input thereto;
   a frequency detector operative to generate a frequency error between a frequency reference and a differentiated variable clock;
   a frequency error accumulator operative to accumulate said frequency error;
   means coupled to said frequency error accumulator, said means for generating said oscillator tuning word in response to said accumulated frequency error; and
   means for freezing the output of said frequency detector so as to prevent perturbations to said loop.

2. A phase locked loop (PLL) for use in a frequency synthesizer, comprising:
   a digitally controlled oscillator (DCO) operative to generate a variable oscillator signal having a frequency determined by an oscillator tuning word input thereto;
   means for generating a variable differentiated phase signal from said variable oscillator signal;
   a frequency detector operative to generate a frequency error between a frequency reference and said variable differentiated phase signal;
   a frequency error accumulator operative to accumulate said frequency error to generate a phase error therefrom; and
   a loop filter operative to filter said phase error to generate said oscillator tuning word thereby;
   wherein said frequency error accumulator comprises means for suspending the accumulation of said frequency error in response to a phase freeze event thereby ignoring subsequent frequency error sample updates.

3. The method according to claim 2, wherein said phase freeze event is generated when said frequency error exceeds a predetermined threshold thus minimizing perturbations to said loop.

4. A phase locked loop (PLL) for use in a frequency synthesizer, comprising:
   a digitally controlled oscillator (DCO) operative to generate a variable oscillator signal having a frequency determined by an oscillator tuning word input thereto;
   differentiator means for generating a differentiated variable phase signal from said variable oscillator signal;
   a frequency detector operative to subtract said differentiated variable phase signal from a reference frequency command word to generate a frequency error therefrom;
   a frequency error accumulator operative to accumulate said frequency error to generate a phase error therefrom, and to stop accumulating said frequency error in response to a phase freeze event thereby preventing subsequent frequency error samples from effecting said loop; and
   a loop filter operative to filter said phase error to generate said oscillator tuning word thereby.

5. The apparatus according to claim 4, wherein freezing accumulating of said frequency error in response to said phase freeze event is operative to eliminate cycle slipping of said phase error.

6. The apparatus according to claim 4, wherein freezing accumulating of said frequency error in response to said phase freeze event is operative to enable extended settling time on one or more DCO capacitor banks.

7. The apparatus according to claim 4, further comprising means for generating said phase freeze event when said frequency error or said phase error perturbation exceeds a predetermined threshold.

8. The apparatus according to claim 4, further comprising means for generating said phase freeze event in response to statistical analysis of said frequency error or said phase error.

9. The apparatus according to claim 4, further comprising means for generating said phase freeze event if a time to digital converter portion of said PLL generates erroneous data.

10. The apparatus according to claim 4, wherein said frequency error accumulator comprises means for resuming accumulating said frequency error in response to termination of said phase freeze event.

11. A method of generating a phase error signal in a phase locked loop (PLL) based frequency synthesizer, said method comprising the steps of:
generating a differentiated variable phase signal from a variable oscillator signal, said variable oscillator signal generated by a digitally controlled oscillator (DCO) operative to generate said variable oscillator signal in response to an oscillator tuning word;
subtracting said differentiated variable phase signal from a frequency reference signal to yield a frequency error therefrom;
accumulating said frequency error to generate a phase error therefrom;
suspending accumulation of said frequency error in response to a phase freeze event thereby preventing subsequent frequency error samples from effecting said loop; and
filtering said phase error signal to yield said oscillator tuning word therefrom.

12. The method according to claim 11, wherein said step of suspending accumulation of said frequency error in response to said phase freeze event is operative to eliminate cycle slipping of said phase error.

13. The method according to claim 11, wherein said step of suspending accumulation of said frequency error in response to said phase freeze event is operative to enable extended settling time on one or more DCO capacitor banks.

14. The method according to claim 11, further comprising the step of generating said phase freeze event when said frequency error or said phase error exceeds a predetermined threshold.

15. The method according to claim 11, further comprising the step of generating said phase freeze event in response to statistical analysis of said frequency error or said phase error.

16. The method according to claim 11, further comprising the step of generating said phase freeze event if a time to digital converter portion of said PLL generates erroneous data.

17. The method according to claim 11, further comprising the step of resuming accumulation of said frequency error in response to termination of said phase freeze event.

18. The method according to claim 11, wherein said step of suspending accumulation effectively turns said PLL loop off for the duration of said phase freeze event.

* * * * *